United States Patent
Mikhaylichenko et al.

(10) Patent No.: US 6,949,411 B1
(45) Date of Patent: Sep. 27, 2005

(54) METHOD FOR POST-ETCH AND STRIP RESIDUE REMOVAL ON CORAL FILMS

(75) Inventors: Katrina Mikhaylichenko, San Jose, CA (US); Michael Ravkin, Sunnyvale, CA (US); John deLarios, Palo Alto, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/033,644

(22) Filed: Dec. 27, 2001

(51) Int. Cl.[7] .................. H01L 21/44; H01L 21/48; H01L 21/50
(52) U.S. Cl. ............ 438/115; 438/691; 438/692; 438/906
(58) Field of Search .................. 438/626, 633, 438/638, 710, 906, FOR 389, 115, 691, 692, 438/700, 782; 430/134, 331

(56) References Cited

U.S. PATENT DOCUMENTS

| | | | |
|---|---|---|---|
| 5,413,952 A * | 5/1995 | Pages et al. ............ 438/406 |
| 5,575,706 A | 11/1996 | Tsai et al. | |
| 5,779,520 A | 7/1998 | Hayakawa | |
| 5,858,109 A | 1/1999 | Hymes et al. | |
| 6,187,684 B1 | 2/2001 | Farber et al. | |
| 6,218,290 B1 * | 4/2001 | Schonauer et al. ......... 438/633 |
| 6,274,478 B1 * | 8/2001 | Farkas et al. ............ 438/626 |
| 6,277,203 B1 | 8/2001 | Jiang et al. | |
| 6,315,637 B1 * | 11/2001 | Apelgren et al. ........... 451/30 |
| 6,482,678 B1 * | 11/2002 | Frost et al. ............. 438/115 |
| 6,495,466 B2 * | 12/2002 | Hara et al. .............. 438/692 |
| 6,734,104 B2 * | 5/2004 | Hara et al. .............. 438/692 |
| 6,774,020 B2 * | 8/2004 | Fukada et al. ........... 438/584 |
| 6,864,169 B2 * | 3/2005 | Noguchi et al. .......... 438/622 |
| 2002/0090784 A1 * | 7/2002 | Yoon | |
| 2002/0105057 A1 * | 8/2002 | Vyvoda et al. | |
| 2004/0026031 A1 * | 2/2004 | Smith et al. ............ 156/293 |

* cited by examiner

Primary Examiner—W. David Coleman
Assistant Examiner—Khiem Nguyen
(74) Attorney, Agent, or Firm—Martine Penilla & Gencarella, LLP

(57) ABSTRACT

A method for cleaning a semiconductor wafer is provided which includes plasma etching a feature into a low K dielectric layer having a photoresist mask where the plasma etching generates etch residues. The method also includes ashing the semiconductor wafer to remove the photoresist mask where the ashing generating ashing residues. The method further includes removing the etching residues and the ashing residues from the low K dielectric layer where the removing is enhanced by scrubbing the low K dielectric layer of the semiconductor wafer with a wet brush that applies a fluid mixture including a cleaning chemistry and a wetting agent.

24 Claims, 7 Drawing Sheets

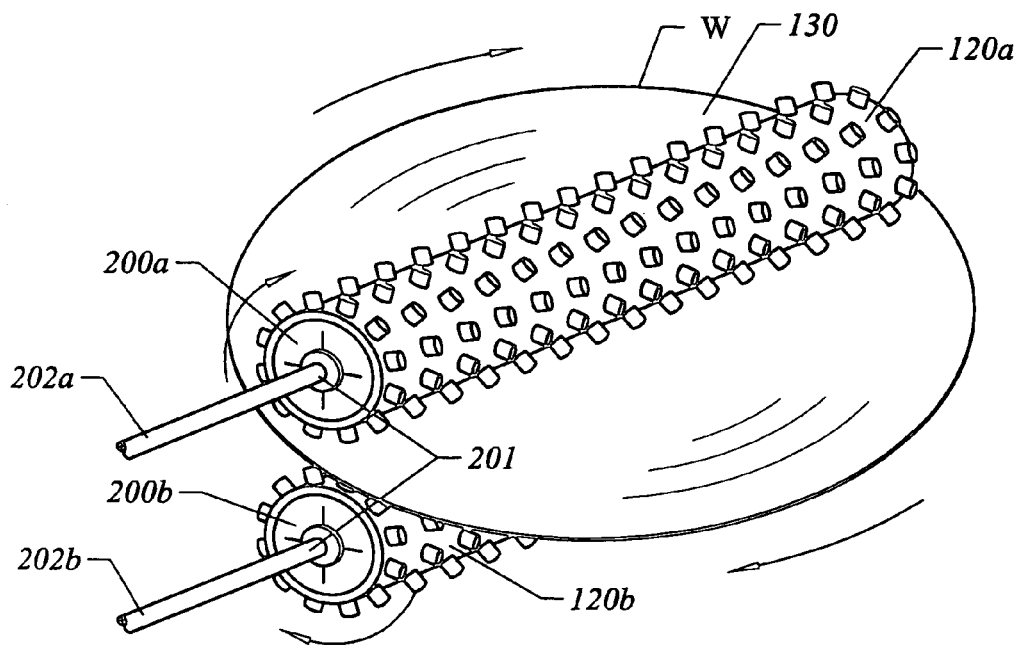
FIG. 3A
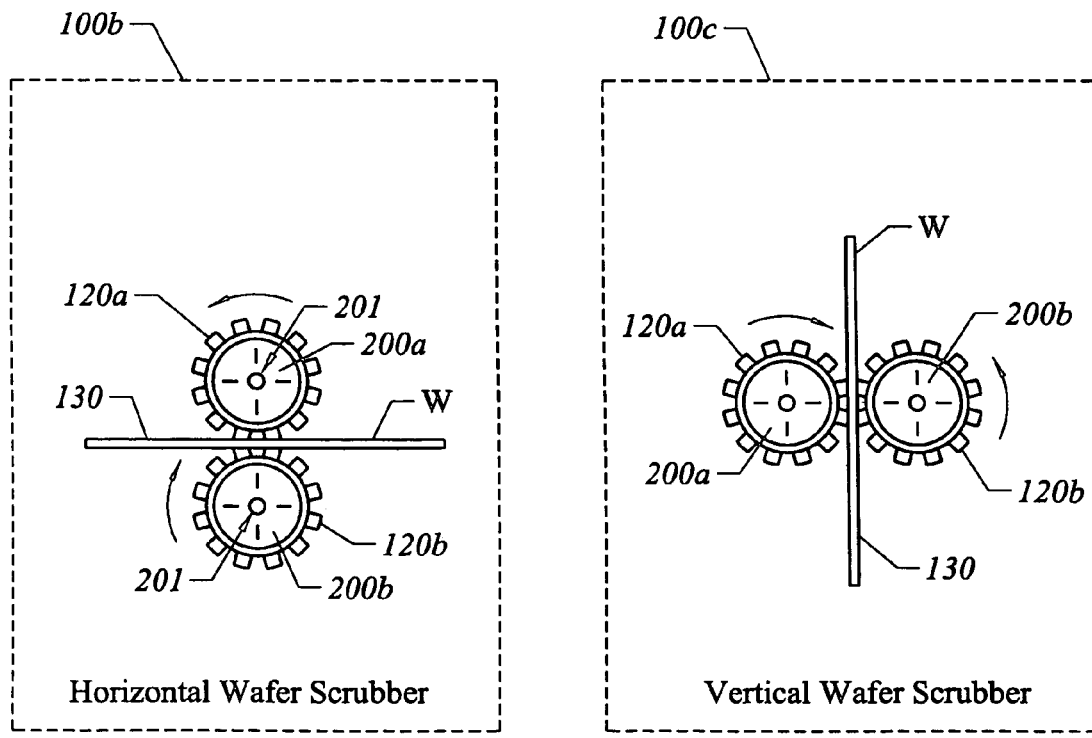
Horizontal Wafer Scrubber
FIG. 3B
Vertical Wafer Scrubber
FIG. 3C

METHOD FOR POST-ETCH AND STRIP RESIDUE REMOVAL ON CORAL FILMS

BACKGROUND OF THE INVENTION

1. Field of the Invention

This invention relates generally to substrate fabrication, and more particularly to semiconductor wafer cleaning after etch operations.

2. Description of the Related Art

As is well known, semiconductor devices are fabricated from semiconductor wafers, which are subjected to numerous processing operations. These operations include, for example, impurity implants, gate oxide generation, intermetal low K dielectric, metallization depositions, photolithography pattering, etching operations, chemical mechanical polishing (CMP), etc.

FIG. 1A illustrates a cross-section partial view of a layer stack, representing the layers formed during the fabrication of a typical semiconductor integrated circuit (IC) device. The layer stack typically can have numerous layers in the stack. Only a top portion of the stack where processing is taking place is shown. Metallization layer 13 typically includes aluminum, copper or one or more of a variety of known aluminum alloys such as Al—Cu, Al—Si, and Al—Cu—Si. Also shown is an anti-reflective coating (ARC) layer 14 that is formed over metallization layer 13. As is well known in the art, ARC layer 14 is typically composed of Ti, TiN or TiW. Generally speaking, ARC layer 14 is useful in preventing light used in photolithography processes from reflecting and scattering off of the metallization layer 13 surface. A low K dielectric layer 16 is then formed over the ARC layer 14. In this simplified example, a photoresist layer 18 is then spin coated over the low K dielectric layer 16 and patterned to define windows where etching is desired. As is well known, photoresist layer 18 represents a layer of conventional photo-sensitive resist material that may be patterned using patterned reticles and a stepper that passes selective light waves onto the surface of photoresist layer 18. The layers of the layer stack are readily recognizable to those skilled in the art and may be formed using any number of known deposition processes, including chemical vapor deposition (CVD), plasma-enhanced chemical vapor deposition (PECVD), physical vapor deposition (PVD) such as sputtering, spin coating, etc.

At this point, an etch operation 20 is performed in order to selectively remove portions of the low K dielectric layer 16. In this example, a feature 17 is etched into the low K dielectric layer 16, and the feature 17 may be a trench, a via hole, or any other geometric pattern. Preferably, the etch 20 is chosen to have good selectivity to enable efficient etching of the low K dielectric 16 layer. During the etching operation, however, polymer formation 22 is known to occur on the sidewalls of features 17 being etched.

FIG. 1B shows the a cross-section view of a layer stack after an ashing operation 23 is conducted after the plasma etching operation. The ashing operation serves to remove the photoresist layer 18. Residue 27 is left after the ashing operation 23. Residue 27 may include both etching residues and ashing residues. The actual composition of the residue 27 depends upon the material being etched, the chemistry used for the etching, the chemistries used for ashing, and the underlying material. Thus, the material representing the residue 27 will generally be a low K dielectric material containing some of the etch chemistry components, ashing chemistry components, carbon from the photoresist, and organic residues. The residue 27 may extend along the sidewalls and up onto the photoresist layer 18. In addition, a residue crown 27' may form on the surface of the low K dielectric layer.

To remove the residue 27, it is conventional practice to move the wafer into a chemical bath containing liquids that are designed to remove the residue 27. Although chemical bath rinsing has worked in the past, the demand for smaller device features has increased the need to have a very clean environment at every step of a fabrication process. Unfortunately, bath rinsing is inherently an unclean environment. The residue 27 being rinsed in the bath may therefore contaminate the bath, and the removed material may be deposited or can attach to other parts of a wafer or to other wafers being processed through the bath.

In addition, conventional methods of cleaning which are generally designed to remove silicon oxide residues after etching and ashing are not effective to clean low K dielectric residues. This is because oxides are hydrophilic and form different types of residues which require different types of cleaning methodology. In contrast, low K dielectrics are hydrophobic and are engineered to have a very low dielectric constant.

In view of the foregoing, there is a need for improved methods that will enable efficient removal of etching and ashing residues that are formed when generating low K dielectric features. The removal should be efficient enough to remove the contaminants and prevent further contamination of other surface areas of a wafer being processed.

SUMMARY OF THE INVENTION

Broadly speaking, the present invention fills these needs by providing an improved method for cleaning low K dielectric features after etching and ashing in a wafer processing operation. It should be appreciated that the present invention can be implemented in numerous ways, including as a process, an apparatus, a system, a device or a method. Several inventive embodiments of the present invention are described below.

In one embodiment, a method for cleaning a semiconductor wafer is provided which includes plasma etching a feature into a low K dielectric layer having a photoresist mask where the plasma etching generates etch residues. The method also includes ashing the semiconductor wafer to remove the photoresist mask where the ashing generating ashing residues. The method further includes removing the etching residues and the ashing residues from the low K dielectric layer where the removing is enhanced by scrubbing the low K dielectric layer of the semiconductor wafer with a wet brush that applies a fluid mixture including a cleaning chemistry and a wetting agent.

In another embodiment, a method for cleaning a semiconductor wafer is provided. The method includes plasma etching a feature into a low K dielectric layer having where the plasma etching generating etch residues in and around the feature, and subjecting the semiconductor wafer to an ashing operation where the ashing operation generating ashing residues. The method also includes scrubbing the low K dielectric layer using a mixture fluid including a cleaning chemistry and a wetting agent where the wetting agent conditions the low K dielectric layer to facilitate cleaning of the etch residues and the ashing residues with the cleaning chemistry.

In yet another embodiment, a method for cleaning a semiconductor wafer is provided. The method includes plasma etching a feature into a low K dielectric layer having where the plasma etching generating etch residues in and around the feature, and subjecting the semiconductor wafer to an ashing operation where the ashing operation generating ashing residues. The method also includes scrubbing the low K dielectric layer using a mixture fluid including a cleaning chemistry and a wetting agent where the wetting agent conditions the low K dielectric layer to facilitate cleaning of the etch residues and the ashing residues with the cleaning chemistry. The method further includes scrubbing the low K dielectric layer using the brush while applying deionized (DI) water after removing the etching residues and the ashing residues.

In another embodiment, a method for cleaning a semiconductor wafer is provided. The method includes plasma etching a feature into a low K dielectric layer having where the plasma etching generating etch residues in and around the feature, and subjecting the semiconductor wafer to an ashing operation where the ashing operation generating ashing residues. The method also includes scrubbing the low K dielectric layer using a mixture fluid including a cleaning chemistry and a wetting agent where the wetting agent conditions the low K dielectric layer to facilitate cleaning of the etch residues and the ashing residues with the cleaning chemistry. The wetting agent is a surfactant and the cleaning chemistry is a standard clean-1 (SC-1) solution including a combination of $NH_4OH$, $H_2O_2$, and deionized (DI) water. The surfactant has a concentration between about 0.005 percent by weight to about 0.1 percent by weight, and the combination ratio of $NH_4OH$, $H_2O_2$, and DI water is between about 1:4:10 and about 1:4:30. The method also includes scrubbing the low K dielectric layer using the brush while applying deionized (DI) water after removing the etching residues and the ashing residues.

The advantages of the present invention are numerous. Most notably, by utilizing a method for optimized mechanical and chemical cleaning of low K dielectric features after an etching and ashing processes, contaminating residues which may form crowns or other contaminating accumulations can be removed in an efficient manner. Specifically, mechanical brushing and use of a fluid mixture with a cleaning chemistry and a wetting agent may advantageously remove contaminating residues from the low K dielectric features and the surface of the low K dielectric layer. Therefore, when low K dielectric materials such as Coral™ is utilized, the fluid mixture in conjunction with brush scrubbing may clean Coral™ films and Coral™ contaminants in an substantially enhanced manner.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 3A illustrates a simplified three-dimensional diagram of a pair of brushes and for scrubbing a top surface and a bottom surface, respectively, of a wafer.

FIGS. 3B and 3C illustrate cross-sectional views of two different orientations for scrubbing a wafer, in accordance with one embodiment of the present invention.

DETAILED DESCRIPTION OF THE PREFERRED EMBODIMENTS

Broadly speaking, the present invention fills these needs by providing methods for efficiently cleaning post etch and post ashing residues when a low K dielectric features is formed in a semiconductor wafer. In the following description, numerous specific details are set forth in order to provide a thorough understanding of the present invention. It will be understood, however, by one of ordinary skill in the art, that the present invention may be practiced without some or all of these specific details. In other instances, well known process operations have not been described in detail in order not to unnecessarily obscure the present invention. It will be obvious, however, to one skilled in the art, that the present invention may be practiced without some or all of these specific details. In other instances, well known process operations have not been described in detail in order not to unnecessarily obscure the present invention.

In general terms, an invention is described for methods of efficiently cleaning etched features of given layers of a semiconductor wafer. Preferably, the cleaning is designed to efficiently remove post plasma etch and post ashing residues and other particulates from in and around etched low K dielectric features. The low K dielectric material is typically engineered to have a dielectric constant ranging between about 1.5 and about 3.5 while silicon dioxide typically has a dielectric constant of about 4.0. In one embodiment Coral™ has a dielectric constant value of between about 2.5 to about 2.8.

Unfortunately, while the low K dielectric polymer material is a much better insulator than the silicon dioxide dielectric materials, and greatly reduces the coupling capacitance between metal lines, it is much harder to clean and remove particles and/or metal contaminants from the surface of the a low K dielectric layer because it is hydrophobic. Consequently, conventional water and other aqueous cleaning fluids are unable to wet the surface and rinse away particle contaminants because they are repelled and bead on the surface of the low dielectric layer.

The following description provided with reference to FIGS. 2A through 3C will introduce exemplary preparation units and their respective orientations in which substrates that utilize low K dielectrics can be processed and cleaned. The flowcharts of FIGS. 4 and 5 will then describe exemplary method operations that can be performed to clean wafers with low K dielectric features after etching and ashing operations. In one embodiment, the methods described herein enable efficient cleaning of residues deposited during etching operations involving low K dielectric layers.

Figure 2A:
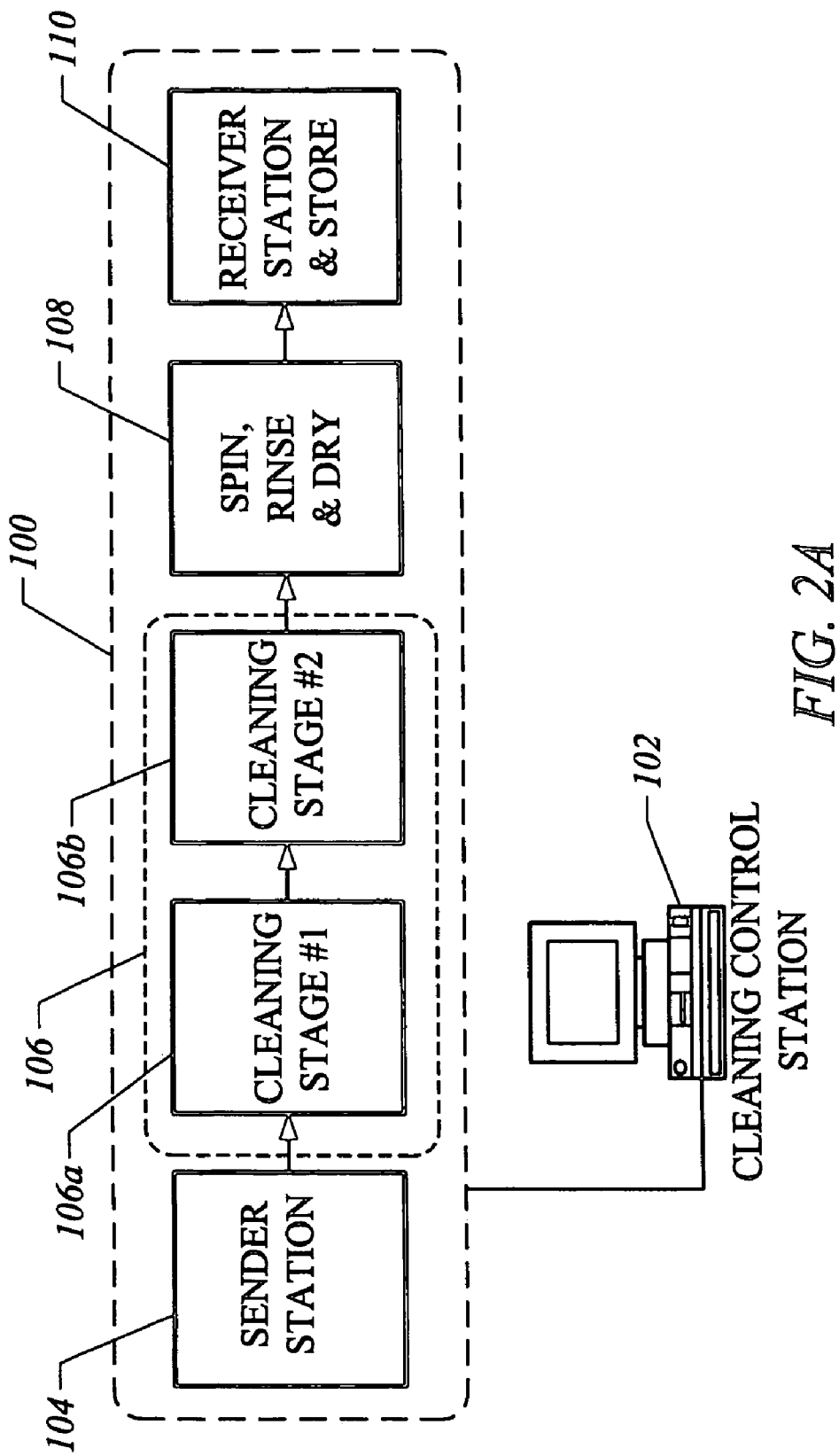
FIG. 2A shows a wafer cleaning station for use in cleaning low K dielectric features that may be controlled in an automated way by a cleaning control station in accordance with one embodiment of the present invention.

FIG. 2A shows a wafer cleaning station 100 for use in cleaning low K dielectric features that may be controlled in an automated way by a cleaning control station 102 in accordance with one embodiment of the present invention. The wafer cleaning station 100 includes a sender station 104, a cleaning stage 106, a spin-rinse and dry (SRD) station 108, and a receiver station 110. It should be understood that cleaning systems can be used to carry out different kinds of substrate preparation operations, such as, cleaning, etching, buffing, and the like. With this in mind, as a broad overview of a cleaning process, semiconductor wafers are initially placed into the sender station 104. The sender station 104 then delivers wafers (one-at-a-time) to the cleaning stage 106. In one embodiment, the cleaning stage 106 is divided into a first cleaning stage 106a and a second cleaning stage 106b, although having just one cleaning stage 106 will also work. After passing through the cleaning stage 106, the wafer is passed through an exit spray in order to remove the cleaning fluids and any contaminants. The SRD station 108 dries the wafer and then it is delivered to the receiver station 110 for temporary storage.

Figure 2B:
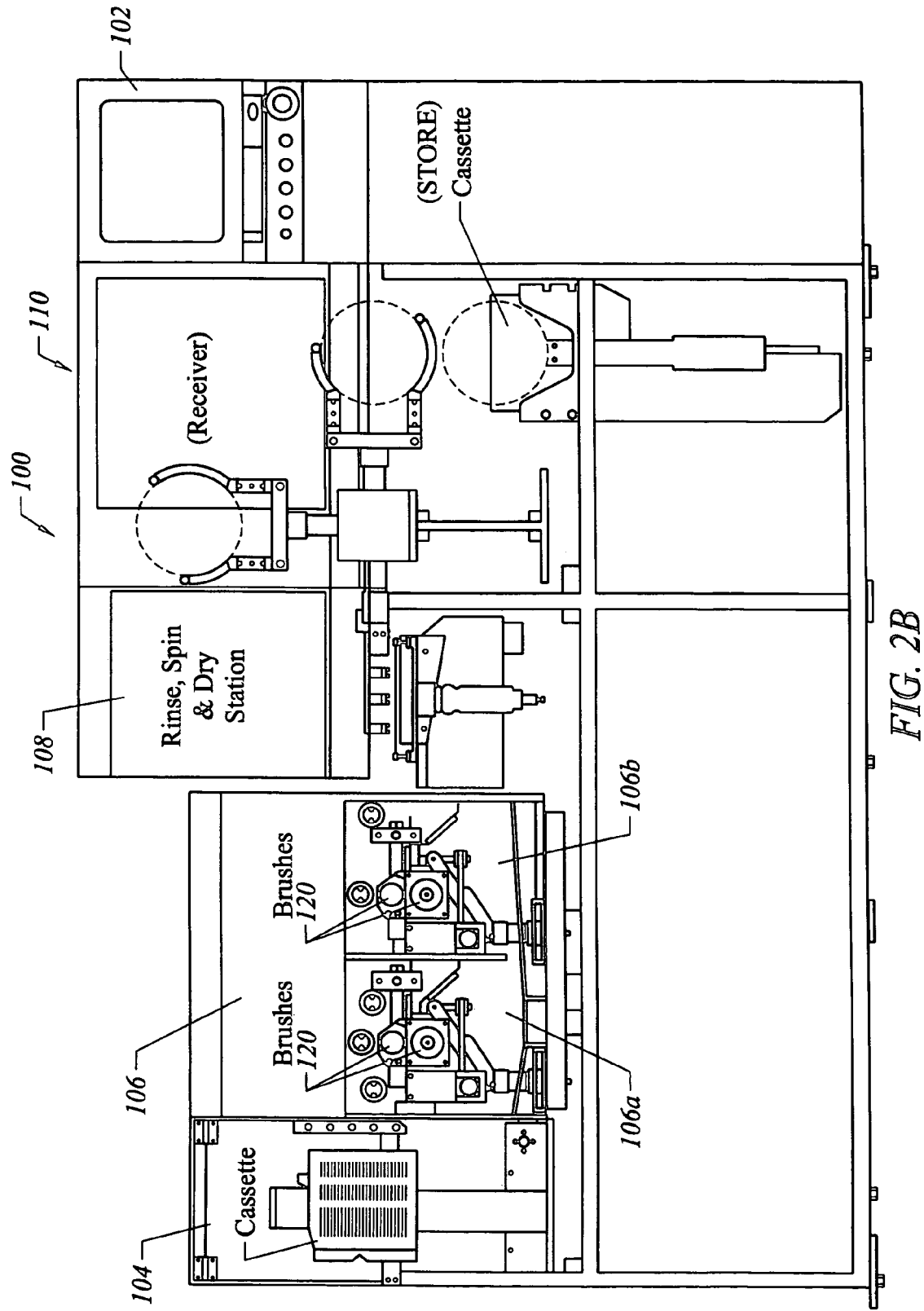
FIG. 2B shows a more detailed schematic of an exemplary wafer cleaning station in accordance with one embodiment of the present invention.

FIG. 2B shows a more detailed schematic of an exemplary wafer cleaning station 100 in accordance with one embodiment of the present invention. Both the sender station 104 and the receiving station 110 are preferably adapted to receive a cassette containing a number of wafers. The first and second cleaning stages 106a and 106b preferably include a set of polyvinyl alcohol (PVA) brushes 120 that have through the brush cleaning fluid application, although fluid can be applied to the brush through the drip manifold. As is well known, the brushes 120 are capable of scrubbing the wafer without damaging the delicate surface.

FIG. 3A illustrates a simplified three-dimensional diagram of a pair of brushes 120a and 120b for scrubbing a top surface and a bottom surface, respectively, of a wafer 130. Typically, the wafer 130 is caused to rotate in a particular direction while the brushes 120 rotate around an axis of rotation and the surface of the brushes 120 are in contact with the surfaces of the wafer 130. The brushes 120a and 120b are mounted on brush cores 200a and 200b. The brush cores 200 are configured to have a shaft 201 which has a fluid inlet 202. The fluid inlet 202 will thus supply the desired fluids into the brush cores 200. The brush cores 200 preferably have a plurality of holes that will allow the fluids to uniformly exit the brush core 200 and evenly supply the desired fluid to the brush 120.

The desired fluid utilized in cleaning low K dielectric features such as, for example, Coral™ features may be a mixture of a cleaning chemistry and a wetting agent. It should be appreciated that the cleaning chemistry may be any suitable combination of chemicals that may enhance cleaning of contaminants such as, for example ammonia, dieionized water, or SC-1 solution. In one embodiment, the cleaning chemistry is a standard clean-1 (SC-1) solution mixed with a surfactant. The SC-1 solution is a combination of $NH_4OH$, $H_2O_2$, and deionized (DI) water. In one embodiment, the SC-1 solution for use with a surfactant for cleaning low K dielectric features has a concentration of between about 1 part $NH_4OH$, 4 parts $H_2O_2$, 30 parts deionized (DI) water and about 1 part $NH_4OH$, 4 parts $H_2O_2$, 10 parts deionized (DI) water, and preferably about 1 part $NH_4OH$, 4 parts $H_2O_2$, 20 parts deionized (DI) water.

The wetting agent may any suitable chemical or a combination of chemicals that may render hydrophobic substances cleanable by the cleaning chemistry. In one embodiment, the wetting agent may be a surfactant such as, for example, hydrocarbon surfactants or fluorinated surfactants. Preferably, the surfactant utilized may be fluorinated surfactants made by 3 M of St. Paul, Minn. Fluorinated surfactants dramatically lower surface tension values at extremely low concentrations when compared to conventional surfactants. Examples of fluorinated surfactants made by 3 M include anionic surfactants, such as FC-93, amphoteric surfactants, such as FC-100, FC-120, cationic surfactants, such as FC-135, and nonionic surfactants, such as FC-171. FC-120 is a preferred choice but others will work as well. Surfactants may provide additional cleaning abilities to the SC-1 solution because low K dielectrics such as, for example, Coral™ TM is generally a hydrophobic compound. Surfactant molecules are amphiphilic, containing both hydrophobic and hydrophilic groups (e.g., a hydrophilic group and a hydrophobic group). Thus, the hydrophobic group of the surfactant molecule is attracted to a hydrophobic surface. When surfactant is applied to the wafer, the hydrophobic group attaches the surfactant molecule to the low K dielectric polymer material.

At the same time, the hydrophilic group of the surfactant molecule attracts SC-1 solution to enable the wetting of the surface of the low K dielectric layer. Because the surface now wets, the contaminants in the low K dielectric features may be removed through the chemical cleaning. In addition, the top and bottom brushes 120a and 120b remove the particle and metal contaminants and sweep them into the cleaning fluids by scrubbing the low K dielectric layer. Therefore, by use of surfactants with the SC-1 solution, hydrophobic materials may be made wettable so both hydrophilic and hydrophobic materials can be cleaned away by the chemicals of the SC-1 solution.

In one embodiment, the SC-1 cleaning solution may be premixed with the surfactant so the fluid mixture that enters the brush cores 200 is the SC-1/surfactant cleaning solution. Therefore, the fluid mixture can be applied through the plurality of holes from the brush core 200 of the brushes 200. In this manner, the wafer with the low K dielectric features may be cleaned with a combination of mechanical energy and chemical removal.

FIGS. 3B and 3C illustrate cross-sectional views of two different orientations for scrubbing a wafer 130, in accordance with one embodiment of the present invention. As shown in FIG. 2B, the wafer is held horizontally while a top brush 120a scrubs the top surface of the wafer 130, and a bottom brush 120b scrubs the bottom surface of the wafer 130. As mentioned above, the wafer 130 is configured to rotate (using rollers not shown) at the same time that the brushes 120 rotate to ensure that the entire surface area of the wafer is properly scrubbed to remove contaminants, etch the surface to a desired degree, or buff the surface. Thus, FIG. 3B illustrates a horizontal wafer scrubber 100b.

In contrast, FIG. 3C illustrates a vertical wafer scrubber 100c in which the wafer 130 is scrubbed while in a vertical position. Typically, the wafer 130 sits on a pair of rollers of the scrubber 100c. The brushes 120 are configured to rotate in a desired direction such that both sides of the wafer 130 are evenly scrubbed, using an equal and opposite pressure on each side of the wafer 130.

Figure 1A:
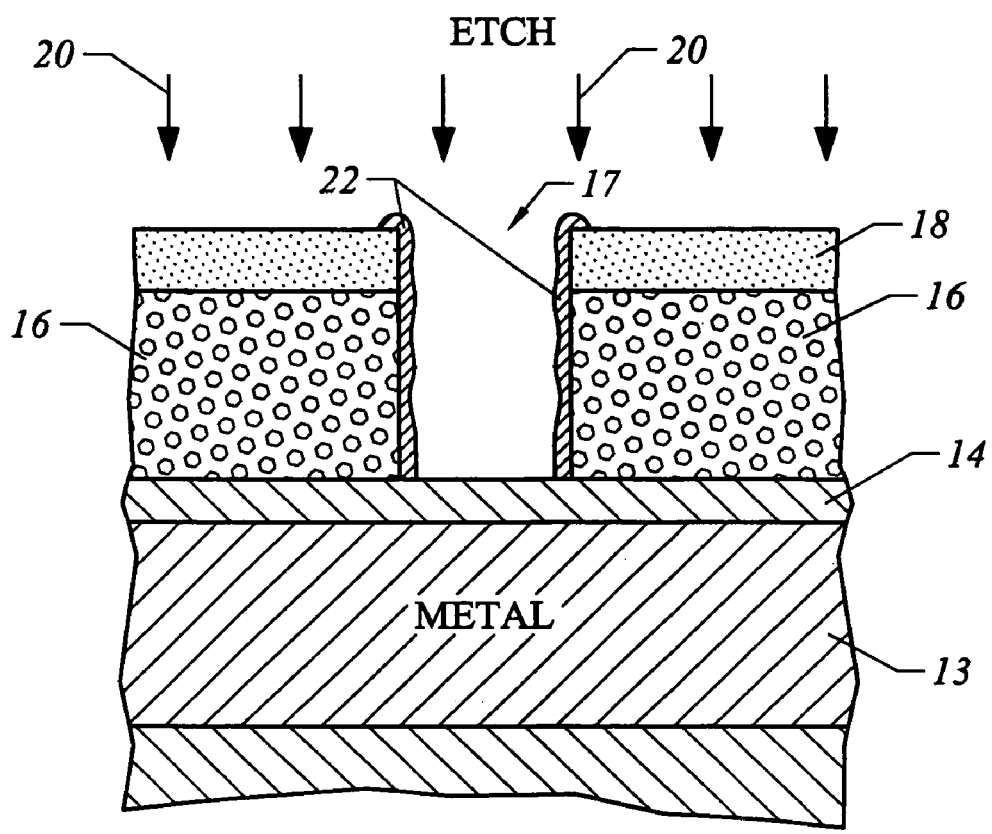
FIG. 1A illustrates a cross-section partial view of a layer stack, representing the layers formed during the fabrication of a typical semiconductor integrated circuit (IC) device.
Figure 1B:
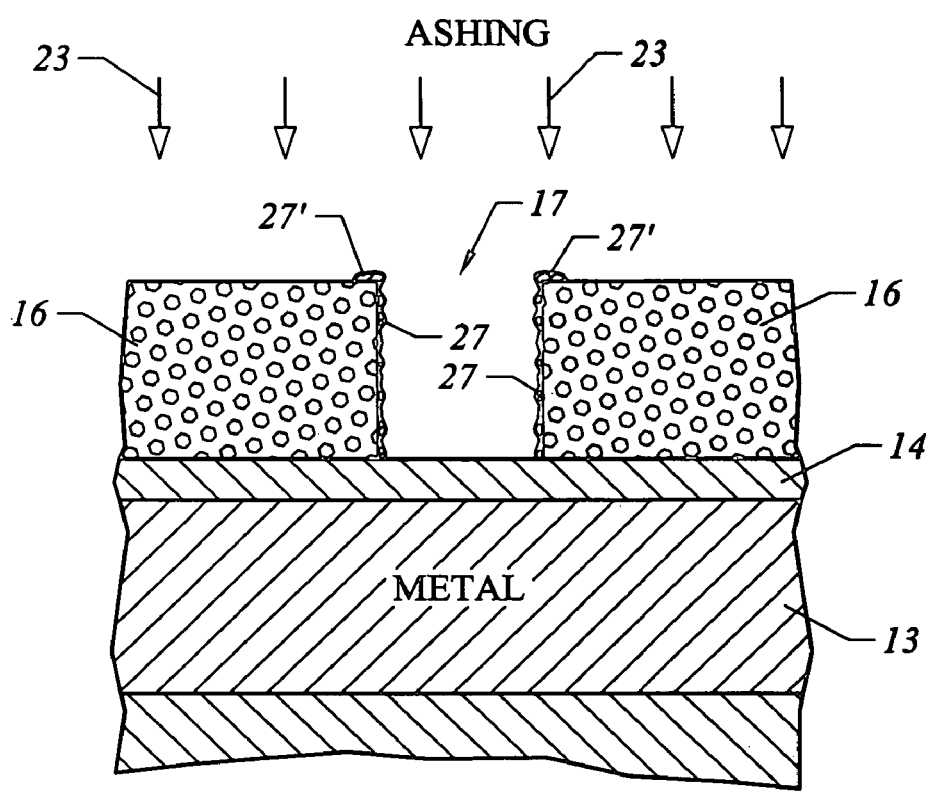
FIG. 1B shows the a cross-section view of a layer stack after an ashing operation is conducted after the plasma etching operation.
Figure 4:
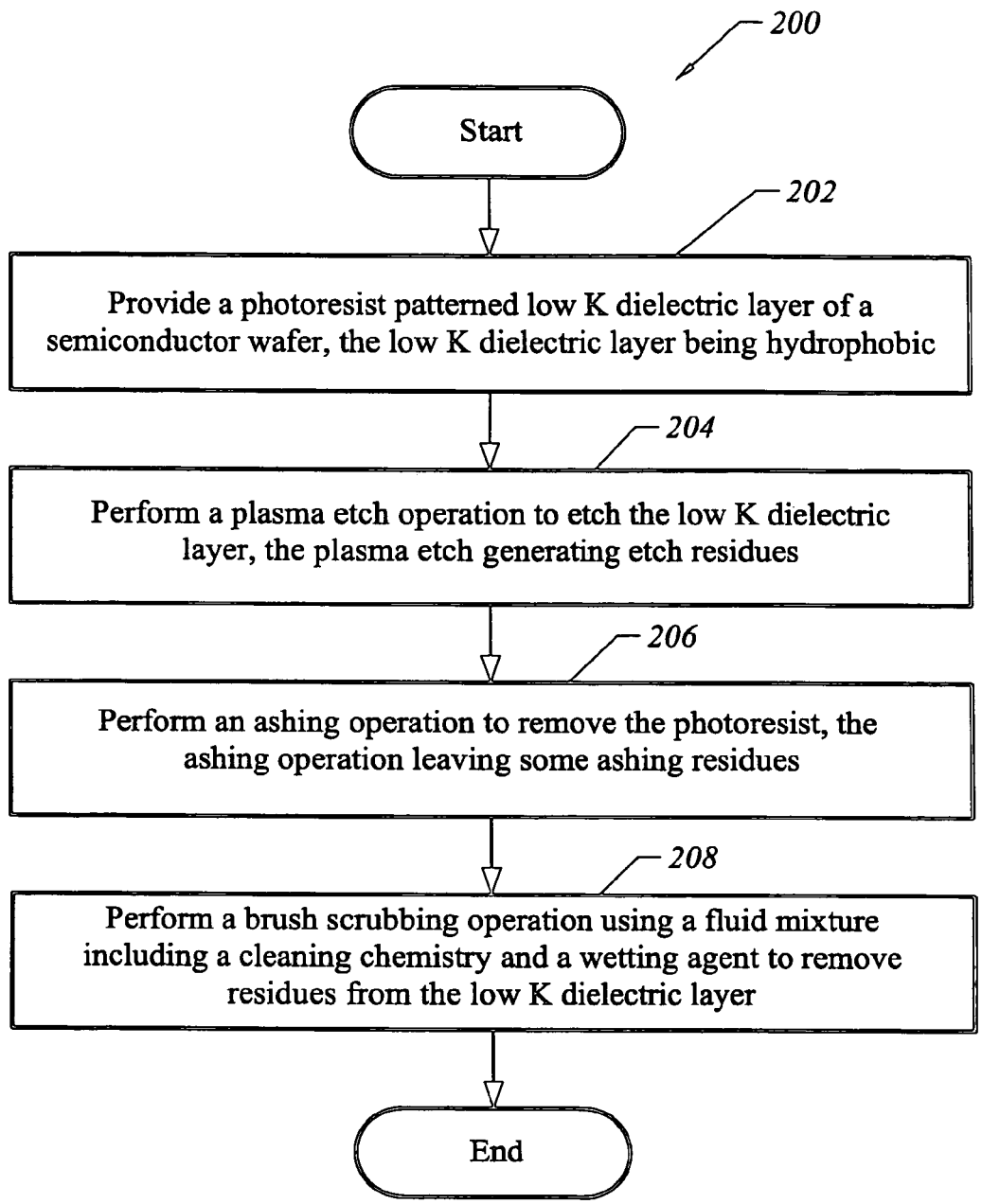
FIG. 4 shows a flowchart that illustrates a method for etching and cleaning low K dielectric features in accordance with one embodiment of the present invention.

FIG. 4 shows a flowchart 200 that illustrates a method for etching and cleaning low K dielectric features in accordance with one embodiment of the present invention. The method begins with operation 202 where a photoresist patterned low K dielectric layer of a semiconductor wafer is provided where the low K dielectric is hydrophobic. As shown in FIG. 1, a semiconductor wafer may have a plurality of layers fabricated thereon, and the photoresist layer is used to pattern a desired layer. In this embodiment, the layer requiring patterning is a low K dielectric layer. It should be appreciated that any suitable type of low K dielectric material may be utilized such as, for example, low K OSG, Black Dimond™, HSQ, etc. In one embodiment, Coral™ made by Novellus Systems, Inc., in San Jose, Calif., may be used as the low K dielectric layer.

After operation 202, the method moves to operation 204 where a plasma etch operation is performed to etch the low K dielectric layer where the plasma etch generates residues. In one embodiment, the plasma etching may be used to perform via hole etching, contact hole etching, trenches, and other features in the low K dielectric layer. Operation 204 typically generates etching residues (as can be seen in FIG. 1) on the etched features. The etching residues may include a composition of the plasma etching chemistries, carbon from photoresist material, the low K dielectric layer being etched, and components from the material that underlies the low K dielectric layer being etched.

Then the method moves to operation 206 which performs an ashing operation to remove the photoresist where the ashing operation leaves some ashing residues To remove the patterned photoresist from over the patterned low K dielectric layer, the method utilizes ashing operations well known to one skilled in the art that are commonly used to remove photoresist materials.

After operation 206 the method moves to operation 208 which performs a brush scrubbing operation using a fluid mixture including a cleaning chemistry and a wetting agent to remove residues from the low K dielectric layer. When the ashing operation is complete and the photoresist material has been removed, the wafer is processed through a brush scrubbing system with the cleaning chemistry and the wetting agent. In one embodiment, the cleaning chemistry may be an SC-1 solution and the wetting agent may be a surfactant. In one embodiment, the brush scrubbing operation can be performed in a brush scrubbing station that incorporates a pair of brushes for evenly brushing each side of the processed semiconductor wafer. Operation 208 is discussed in further detail in reference to FIG. 5.

Figure 5:
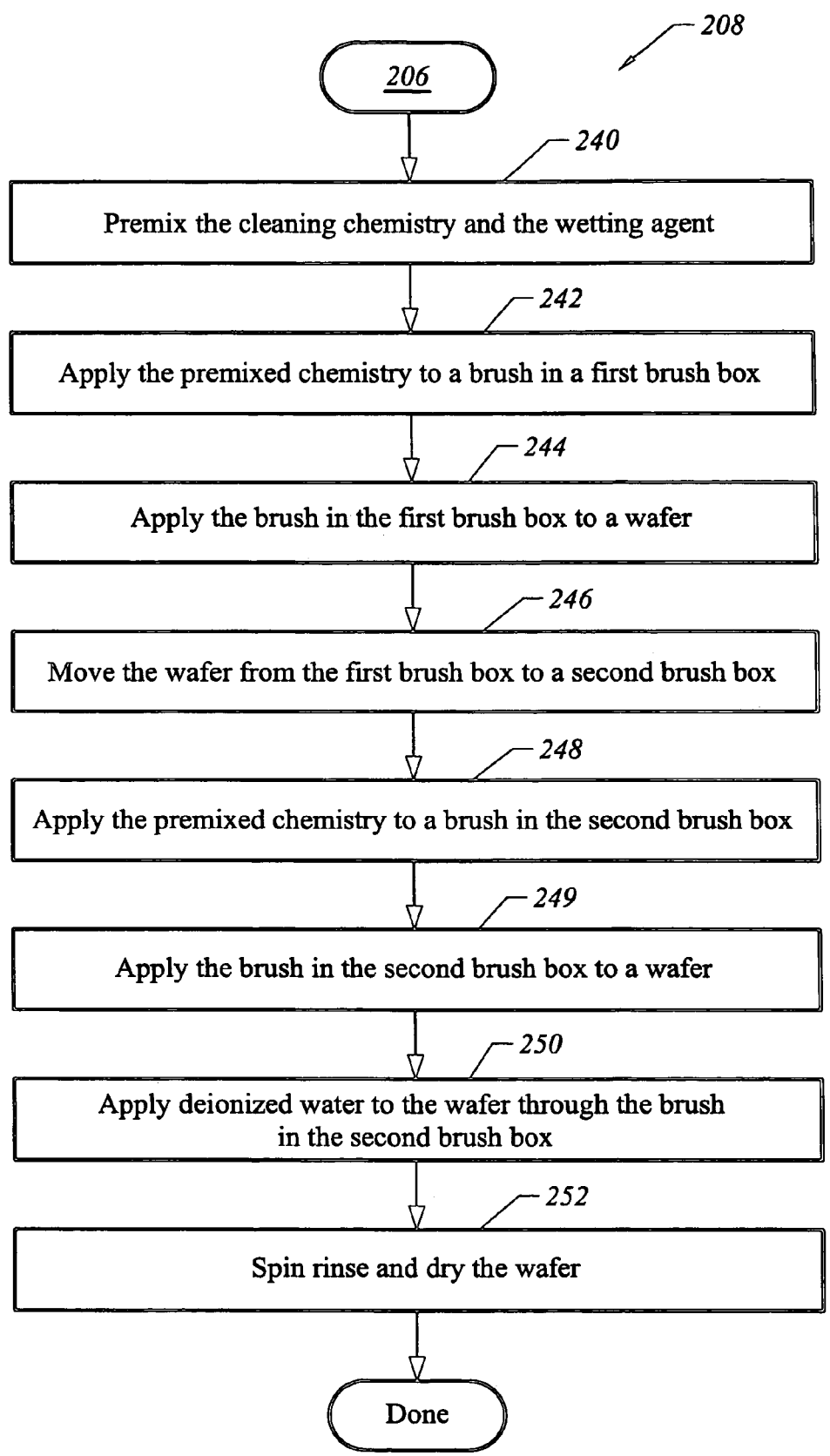
FIG. 5 illustrates a flow chart defining the performance of a brush scrubbing operation with cleaning chemistry and a wetting agent to remove the generated low K dielectric etch residues and ashing residues in accordance with one embodiment of the present invention.

FIG. 5 illustrates a flow chart 208 defining the performance of a brush scrubbing operation with cleaning chemistry and a wetting agent to remove the generated low K dielectric etch residues and ashing residues in accordance with one embodiment of the present invention. It should be understood that the cleaning processes described herein may be conducted in any suitable type of wafer cleaning system such as, for example, the ones described in FIGS. 2A and 2B. The flow chart 208 begins with operation 240 where the cleaning chemistry and the surfactant is premixed. The cleaning chemistry and the surfactant may be those as described in reference to FIG. 3A.

Then operation 242 applies the premixed chemistry to a brush in a first brush box. In one embodiment, the brushing operation is designed to be performed by supplying the premixed chemistry through the brush (TTB) for application of the premixed chemistry to the surface of the wafer. It should be appreciated that other suitable ways to apply the premixed chemistry to the brush (such as also described in operation 248 below in reference to a brush in a second brush box) may be utilized such as, for example, dripping the solution to the brush surface. It should also be understood that two brushes may be utilized in the first brush box and second brush box to clean both sides of the wafer. In TTB operations, the premixed chemistry is supplied to a brush core from which the premixed chemistry is supplied to the surface of the brush through a plurality of holes.

After operation 242, the method moves to operation 244 which applies the brush in the first brush box to a wafer. The application of the brush to the wafer enables the scrubbing of the surface for a period of, in one embodiment, between about 15 seconds and about 60 seconds, and preferably around 35 seconds. The premixed chemistry may be continuously supplied to the brush during the scrubbing process. In one embodiment, the pH of the brush is kept constant where the pH of the is between about 9 and about 13. It should be noted that brush scrub cleaning in the context of post etch and ashing operations of low K dielectric features is substantially different that the conventional technique of chemical bath treatment or chemical spray treatment. Therefore, by using both the premixed chemistry for chemical cleaning and mechanical scrubbing by the brush, residues (e.g. the etching residues and the ashing residues) on both the surface of the wafer and within the low K dielectric features may be effectively cleaned.

Then the method advances to operation 246 which moves the wafer from the first brush box to a second brush box. In operation 246, scrubbing in the first brush box is stopped and the wafer is transported to the second brush box for further wafer cleaning. After operation 246, the method progresses to operation 248 where the premixed chemistry is applied to a brush in the second brush box. Application of the premixed chemistry to the brush may keep the brush from becoming loaded with contaminants (e.g., etching and ashing residues). In operation 248, the same premixed chemistry as utilized in the first brush box may be applied, in one embodiment, TTB to the second brush.

Then the method moves to operation 249 which applies the brush in the second brush box to a wafer. It should be appreciated that the brush may scrub for any suitable period of time. In one embodiment, the brush may scrub the wafer between about 2 and 20 seconds, and preferably 5 seconds. During this time, the premixed chemistry may be continuously supplied to the brush.

After operation 249, the method proceeds to operation 250 which applies deionized (DI) water to the wafer through the brush in the second brush box. Operation 250 removes the premixed chemistry and any remaining contaminants from the wafer. It should be understood that the DI water application to the wafer may progress for any suitable period of time. In one embodiment, the DI water is applied to the wafer through the brush between about 20 seconds to about 50 seconds, and preferably about 30 seconds. Any suitable DI water flow rate may be utilized in operation 250. In one embodiment, the flow rate of DI water is between about 1200 ml per minute to about 3500 ml per minute, and preferably about 3000 ml per minute. Alternatively, DI water may be applied to the wafer through a separate set of rinse nozzles. It should be understood that the brush scrubbing operation that includes the delivery of chemicals followed by a DI water rinse is configured to yield a high degree of cleanliness while removing the generated etch residues and ashing residues from within the etched low K dielectric features, as well as removing other particulates and contaminants that may have been deposited during the ashing operation.

Then the flowchart 208 ends with operation 252 where a spin, rinse, and dry operation is conducted on the wafer. In one embodiment, operation 252 dries the wafer and delivers a wafer to a receiver station for temporary storage.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. A method for cleaning a semiconductor wafer, comprising:
    plasma etching a feature into a low K dielectric layer having a photoresist mask, the plasma etching generating etch residues;
    ashing the semiconductor wafer to remove the photoresist mask, the ashing generating ashing residues; and
    removing the etching residues and the ashing residues from the low K dielectric layer having the plasma etched feature, the removing being enhanced by scrubbing the low K dielectric layer of the semiconductor wafer with a wet brush that applies a fluid mixture including a cleaning chemistry and a wetting agent.

2. A method for cleaning a semiconductor wafer as recited in claim 1, wherein the wetting agent is a surfactant and the cleaning chemistry includes a combination of $NH_4OH$, $H_2O_2$, and deionized (DI) water.

3. A method for cleaning a semiconductor wafer as recited in claim 2, wherein the surfactant is selected from a group comprising fluorosurfactants and hydrocarbon surfactants.

4. A method for cleaning a semiconductor wafer as recited in claim 3, wherein the surfactant has a concentration between about 0.005 percent by weight to about 0.1 percent by weight.

5. A method for cleaning a semiconductor wafer as recited in claim 3, wherein the surfactant has a concentration of about 0.01 percent by weight.

6. A method for cleaning a semiconductor wafer as recited in claim 2, wherein the combination ratio of $NH_4OH$, $H_2O_2$, and DI water is between about 1:4:10 and about 1:4:30.

7. A method for cleaning a semiconductor wafer as recited in claim 6, wherein the combination ratio of $NH_4OH$, $H_2O_2$, and DI water is about 1:4:20.

8. A method for cleaning a semiconductor wafer as recited in claim 1, further comprising:
    scrubbing the low K dielectric layer using the brush while applying deionized (DI) water after removing the etching residues and the ashing residues.

9. A method for cleaning a semiconductor wafer, comprising:
    plasma etching a feature into a low K dielectric layer, the plasma etching generating etch residues in and around the feature;
    subjecting the semiconductor wafer to an ashing operation, the ashing operation generating ashing residues; and
    scrubbing the low K dielectric layer having the plasma etched feature, using a mixture fluid including a cleaning chemistry and a wetting agent, the wetting agent being configured to condition the low K dielectric layer to facilitate cleaning of the etch residues and the ashing residues with the cleaning chemistry.

10. A method for cleaning a semiconductor wafer as recited in claim 9, further comprising:
    scrubbing the low K dielectric layer using the brush while applying deionized (DI) water after removing the etching residues and the ashing residues.

11. A method for cleaning a semiconductor wafer as recited in claim 9, wherein the wetting agent is a surfactant and the cleaning chemistry includes a combination of $NH_4OH$, $H_2O_2$, and deionized (DI) water.

12. A method for cleaning a semiconductor wafer as recited in claim 11, wherein the surfactant is selected from a group comprising fluorinated surfactants and hydrocarbon surfactants.

13. A method for cleaning a semiconductor wafer as recited in claim 11, wherein the surfactant has a concentration between about 0.005 percent by weight to about 0.1 percent by weight.

14. A method for cleaning a semiconductor wafer as recited in claim 11, wherein the surfactant has a concentration of about 0.01 percent by weight.

15. A method for cleaning a semiconductor wafer as recited in claim 11, wherein the combination ratio of $NH_4OH$, $H_2O_2$, and DI water is between about 1:4:10 and about 1:4:30.

16. A method for cleaning a semiconductor wafer as recited in claim 11, wherein the combination ratio of $NH_4OH$, $H_2O_2$, and DI water is about 1:4:20.

17. A method for cleaning a semiconductor wafer, comprising:
    plasma etching a feature into a low K dielectric layer, the plasma etching generating etch residues in and around the feature;
    subjecting the semiconductor wafer to an ashing operation, the ashing operation generating ashing residues;
    scrubbing the low K dielectric layer having the plasma etched feature, using a mixture fluid including a cleaning chemistry and a wetting agent, the wetting agent being configured to condition the low K dielectric layer to facilitate cleaning of the etch residues and the ashing residues with the cleaning chemistry; and
    scrubbing the low K dielectric layer having the plasma etched feature, using the brush while applying deionized (DI) water after removing the etching residues and the ashing residues.

18. A method for cleaning a semiconductor wafer as recited in claim 17, wherein the wetting agent is a surfactant and the cleaning chemistry includes a combination of $NH_4OH$, $H_2O_2$, and deionized (DI) water.

19. A method for cleaning a semiconductor wafer as recited in claim 17, wherein the surfactant is selected from a group comprising fluorinated surfactants and hydrocarbon surfactants.

20. A method for cleaning a semiconductor wafer as recited in claim 18, wherein the surfactant has a concentration between about 0.005 percent by weight to about 0.1 percent by weight.

21. A method for cleaning a semiconductor wafer as recited in claim 18, wherein the surfactant has a concentration of about 0.01 percent by weight.

22. A method for cleaning a semiconductor wafer as recited in claim 18, wherein the combination ratio of $NH_4OH$, $H_2O_2$, and DI water is between about 1:4:10 and about 1:4:30.

23. A method for cleaning a semiconductor wafer as recited in claim 18, wherein the combination ratio of $NH_4OH$, $H_2O_2$, and DI water is about 1:4:20.

24. A method for cleaning a semiconductor wafer, comprising:
    plasma etching a feature into a low K dielectric layer, the plasma etching generating etch residues in and around the feature;

subjecting the semiconductor wafer to an ashing operation, the ashing operation generating ashing residues;

scrubbing the low K dielectric layer having the plasma etched feature, using a mixture fluid including a cleaning chemistry and a wetting agent, the wetting agent being configured to condition the low K dielectric layer to facilitate cleaning of the etch residues and the ashing residues with the cleaning chemistry, the wetting agent being a surfactant and the cleaning chemistry being a standard clean-1 (SC-1) solution including a combination of $NH_4OH$, $H_2O_2$, and deionized (DI) water, the surfactant having a concentration between about 0.005 percent by weight to about 0.1 percent by weight, combination ratio of $NH_4OH$, $H_2O_2$, and DI water being between about 1:4:10 and about 1:4:30; and scrubbing the low K dielectric layer having the plasma etched feature, using the brush while applying deionized (DI) water after removing the etching residues and the ashing residues.

* * * * *